US010101619B2

(12) United States Patent
Miyazawa et al.

(10) Patent No.: US 10,101,619 B2
(45) Date of Patent: Oct. 16, 2018

(54) DISPLAY DEVICE AND DRIVING METHOD FOR THE SAME

(71) Applicant: Japan Display Inc., Tokyo (JP)

(72) Inventors: Toshio Miyazawa, Tokyo (JP); Shigeru Sakamoto, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/619,651

(22) Filed: Jun. 12, 2017

(65) Prior Publication Data
US 2017/0276983 A1    Sep. 28, 2017

Related U.S. Application Data

(63) Continuation of application No. PCT/JP2015/085070, filed on Dec. 15, 2015.

(30) Foreign Application Priority Data

Dec. 22, 2014 (JP) .................................. 2014-258410

(51) Int. Cl.
*G09G 3/30* (2006.01)
*G02F 1/135* (2006.01)
(Continued)

(52) U.S. Cl.
CPC .......... *G02F 1/1354* (2013.01); *G02F 1/0018* (2013.01); *G09G 3/20* (2013.01);
(Continued)

(58) Field of Classification Search
CPC .. G09G 3/30; G09G 3/36; G09G 3/32; G09G 3/34; G09G 5/00; G06F 3/038
See application file for complete search history.

(56) References Cited

U.S. PATENT DOCUMENTS 5,714,968 A    2/1998  Ikeda
2001/0052597 A1   12/2001  Young et al.
(Continued)

FOREIGN PATENT DOCUMENTS

JP    S59-133586 A    7/1984
JP    H08-54836 A    2/1996
(Continued)

OTHER PUBLICATIONS

Partial English Translation of International Search Report dated Mar. 15, 2016 for the PCT application No. PCT/JP2015/085070.
(Continued)

*Primary Examiner* — Pegeman Karimi
(74) *Attorney, Agent, or Firm* — Typha IP LLC

(57) ABSTRACT

A display device has a transistor including a gate terminal, a first input-output terminal and a second input-output terminal, the gate terminal connected to a scanning signal line and the first input-output terminal connected to a video signal line, a photoconductive element including a first terminal and a second terminal, the first terminal connected to the second input-output terminal of the transistor and the second terminal connected to a first power line, and a light-emitting element including a third terminal and a fourth terminal, the third terminal connected to the second input-output terminal of the transistor and the fourth terminal connected to a second power line.

10 Claims, 16 Drawing Sheets

(51) Int. Cl.
  *G09G 3/20*   (2006.01)
  *H01L 51/50*  (2006.01)
  *H05B 33/08*  (2006.01)
  *G09G 3/32*   (2016.01)
  *G02F 1/00*   (2006.01)

(52) U.S. Cl.
  CPC .............. *G09G 3/32* (2013.01); *H01L 51/50* (2013.01); *H05B 33/0803* (2013.01)

(56) References Cited

U.S. PATENT DOCUMENTS

| | | |
|---|---|---|
| 2003/0142047 A1 | 7/2003 | Inoue et al. |
| 2005/0017934 A1 | 1/2005 | Chung et al. |
| 2005/0225683 A1 | 10/2005 | Nozawa |
| 2010/0134735 A1 | 6/2010 | Nakamura et al. |

FOREIGN PATENT DOCUMENTS

| | | |
|---|---|---|
| JP | 2003-536115 A | 12/2003 |
| JP | 2005-031630 A | 2/2005 |
| JP | 2005-300897 A | 10/2005 |
| JP | 2010-153834 A | 7/2010 |
| WO | 02/075711 A1 | 9/2002 |

OTHER PUBLICATIONS

International Search Report dated Mar. 15, 2016 for the PCT application No. PCT/JP2015/085070.
Written Opinion of the International Search Authority dated Mar. 15, 2016 for the PCT application No. PCT/JP2015/085070.

DISPLAY DEVICE AND DRIVING METHOD FOR THE SAME

CROSS-REFERENCE TO RELATED APPLICATIONS

This application is based upon and claims the benefit of priority from the prior Japanese Patent Application No. 2014-258410, filed on Dec. 22, 2014 and PCT International Patent Application No. PCT/JP2015/085070, filed on Dec. 15, 2015, the entire contents of which are incorporated herein by reference.

FIELD

The present invention relates to a structure of pixels and a structure of a pixel circuit of a display device, and a method for driving a display device.

BACKGROUND

A display device in which pixels are included by light-emitting elements formed of a light-emitting layer including organic electroluminescence materials has been developed as a flat plate display device. This display device is provided with a circuit (hereinafter referred to as "pixel circuit") for controlling the light emission timing and luminance of the light-emitting element in the display portion.

The pixel circuit includes a switching element for retrieving video signals and a drive transistor for controlling the current of the light-emitting element as a basic structure. The gate voltage of the drive transistor is controlled by video signals, and controls luminance by flowing drain current into the light-emitting element based on the gate voltage. The drive transistor is realized by a thin film transistor formed by semiconductor thin film. In the pixel circuit, basically, the characteristics of the drive transistors of each of the pixels are assumed to be uniform. If the drain current of the driving transistor is uniformly set by the gate voltage, the luminance of the light-emitting element is made uniform, and by this an accurate gradation display is realized.

However, the threshold voltage of the thin film transistor is difficult to control during the manufacturing process, and normally varies from pixel to pixel. The fluctuation of the threshold voltage of the drive transistor influences the drain current, and as a result causes the luminance of the light-emitting element to vary. In a display device, a variation in the luminance of each pixel is visible as an uneven display. For this reason, in the pixel circuit of the display device, a circuit for compensating for the threshold voltage of the drive transistor provided in each pixel is necessary (for example Japanese Laid-Open Patent Publication No. 2005-031630).

Another problem of the display device in which pixels are configured in the light-emitting element is that luminance deteriorates when the characteristics of the light-emitting element itself vary. The light-emitting element has the problem of varying luminance and a decrease in luminance over time, even if the constant current is supplied. In order to prevent decreased visibility due to varying luminance and deterioration of luminance of the light-emitting layer, a display device provided with a photoelectric conversion element in the pixels is disclosed (see Japanese Laid-Open Patent Publication No. 2005-300897 and Japanese Translation of PCT International Application Publication No. 2003-536115). This display device is provided with a feedback type pixel circuit in which a photoelectric conversion element receives part of the light emitted by the light-emitting element and which controls the drive current of the light-emitting element in response to luminance.

According to the display device disclosed in Japanese Laid-Open Patent Publication No. 2005-031630, in order to configure a threshold voltage compensation circuit, six transistors and one capacitive element are necessary for one pixel. Since it is necessary for this pixel circuit to be provided with many elements in one pixel, the problem of the surface area necessary for forming one pixel becoming greater arises.

According to the display device disclosed in Japanese Laid-Open Patent Publication No. 2005-300897 and Japanese Translation of PCT International Application Publication No. 2003-536115, since the drive current of the light-emitting element is controlled by a transistor, it is necessary to provide a threshold voltage compensation circuit in the pixel for compensating for the threshold voltage of this transistor.

Since it is necessary to provide many elements for one pixel in order to stabilize the luminance of the light-emitting element and achieve improved image quality, it is difficult to achieve high-definition conventional display devices using light-emitting elements.

SUMMARY

The display device according to an embodiment of the present invention has a transistor including a gate terminal, a first input-output terminal and a second input-output terminal, the gate terminal connected to a scanning signal line and the first input-output terminal connected to a video signal line, a photoconductive element including a first terminal and a second terminal, the first terminal connected to the second input-output terminal of the transistor and the second terminal connected to a first power line, and a light-emitting element including a third terminal and a fourth terminal, the third terminal connected to the second input-output terminal of the transistor and the fourth terminal connected to a second power line. A video signal voltage is input to the first terminal of the light emitting element and the light-emitting element emits light based on the transistor turned on at time t1, when the light-emitting element emits light to the photoconductive element, a resistance of the photoconductive element transfers from a high-resistance state to a low-resistance state, a current for maintaining a light-emitting state is supplied from the first power line to the light-emitting element, even after the transistor turns off at time t2 which is later than time t1.

The display device according to an embodiment of the present invention has a transistor including a gate connected to a scanning signal line, and one of a source and a drain connected to a video signal line, a light-emitting element including a pixel electrode, a light-emitting layer above the pixel electrode, and a common pixel electrode, and a photoconductive element including a first electrode, a second electrode, and a photoconductive layer connected to each of the first electrode and the second electrode. The pixel electrode is connected to another of the source and the drain of the transistor, the first electrode is connected to the pixel electrode, and the second electrode is connected to a power line, when a video signal voltage is input into the light-emitting element and the light-emitting element emits light based on the transistor turned on at time t1, when the photoconductive element receives a light of the light-emitting element, a resistance of the photoconductive element transfers from a high-resistance state to a low-resistance state, and a current for maintaining a light-emitting state is supplied from the first power line to the light-emitting element, even after the transistor turns off at time t2 which is later than time t1.

The driving method of a display device according to an embodiment of the present invention applying a video signal voltage to a node N1 which is the other end of a source and a drain by turning on a transistor in which one of the source and drain is connected to a video signal line at time t1, emitting a light-emitting element connected between the other end of the source and drain of the transistor and the node N1 based on the voltage of the node N1, transitioning the resistance of the photoconductive element connected between the power line and the node N1 from a high-resistance state to a low-resistance state by the light emission of the light-emitting element, and supplying an active current for maintaining the light-emitting state from the power line to the light-emitting element, even after the transistor turns off at time t2.

DESCRIPTION OF EMBODIMENTS

Hereinafter, the embodiments of the present invention will be described while referencing the drawings. However, the present invention may be implemented in many different ways, therefore interpretation should not be limited to the content exemplified in the embodiments below. In order to provide a clearer description, some components of the drawings such as the width, thickness, shape, etc. of each part are represented schematically. These drawings are merely examples and do not limit the interpretation of the present invention. In this specification and each of the drawings, elements similar to previously described elements are marked with the same symbols and detailed descriptions are omitted accordingly.

In this specification, when certain components or regions are described as being "above" or "below" other components or regions, as long as there are no limitations, it does not necessarily mean they are directly above or below. This description includes cases in which a component or region is located higher or lower than another component or region. That is to say, other structural elements are located between the component or region being described and the component or region above or below.

Structure of Display Device

Figure 1:
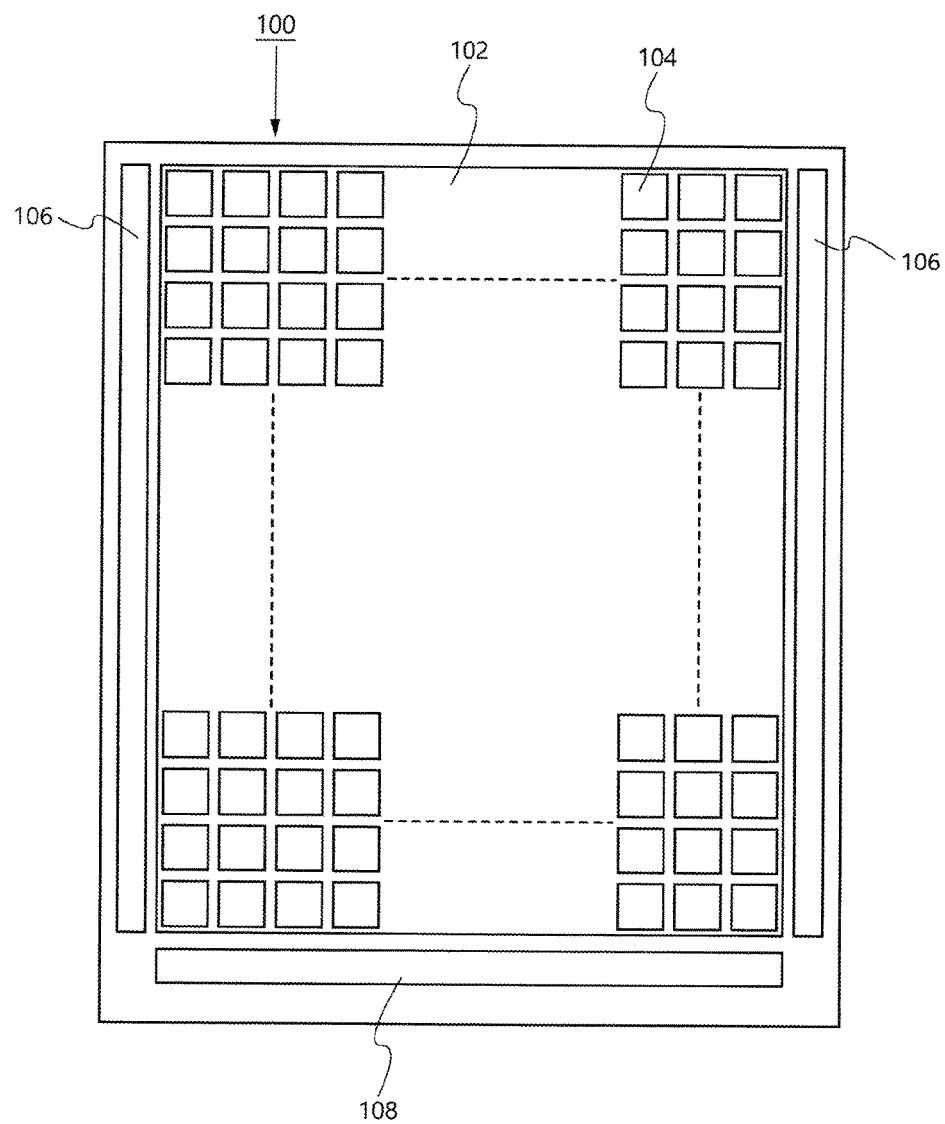
FIG. 1 is a diagram showing the structure of the display device according to an embodiment of the present invention.

FIG. 1 shows the structure of the display device 100 according to the present embodiment. The display device 100 is configured including a pixel part 102 forming a display screen, a scanning signal line drive circuit 106 for outputting scanning signals to the pixel part 102, and a video signal line drive circuit 108 for outputting video signals to the pixel part 102. The pixel part 102 is formed of a pixel circuit in which a plurality of pixels 104 are arranged. A light-emitting element is provided in each pixel 104.

Figure 2:
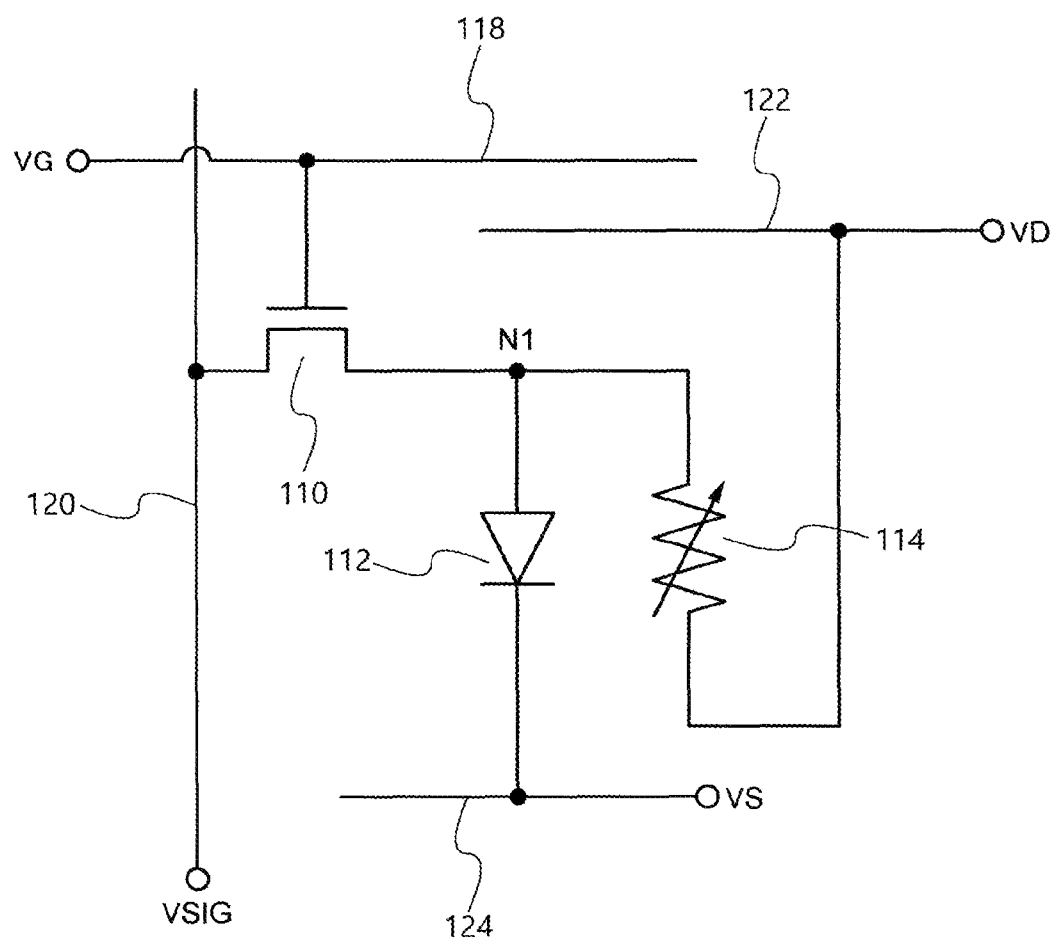
FIG. 2 is a diagram showing the circuit structure of a pixel of the display device according to an embodiment of the present invention.

FIG. 2 shows an equivalent circuit of the pixel 104 according to the present embodiment. The pixel circuit shown in FIG. 2 is configured including a light-emitting element 112, a transistor 110, and a photoconductive element 114. The point at which these elements are commonly connected is indicated as the node N1.

In the transistor 110, a gate terminal which is a control terminal is connected to a scanning signal line 118, and one of a source and drain which is an input-output terminal is connected to a video signal line 120. The transistor 110 has a function for controlling the electrical connection between the video signal line 120 and the node N1. The photoconductive element 114 is substantially a two-terminal element, one terminal is connected to a first power line 122, and the other terminal is connected to the node N1. In the light-emitting element 112, one terminal is connected to a second power line 124 and the other terminal is connected to the node N1.

In the scanning signal line 118, the scanning signal controlling the on-off operation of the transmitter 110 is input from the scanning signal line drive circuit 106. The scanning signal applies a gate voltage turning on the transistor 110 during the timing in which each pixel retrieves a video signal from the video signal line 120, and applies a voltage that turns off during other timings. When the transistor 110 is turned on, voltage is applied to the node N1 based on the video signal.

The light-emitting element 112 emits light when a video signal voltage VSIG greater than the light-emitting threshold voltage VthOL is applied to the node N1. Light emitted from the light-emitting layer becomes the outgoing light of the pixel. A portion of the light emitted from the light-emitting layer becomes the irradiated light of the photoconductive element 114. The photoconductive element 114 has a characteristic in which the reduction rate of the light state (state in which light radiates) decreases with respect to the dark state. The photoconductive element 114 has a characteristic in which the resistance value changes in response to the amount of irradiated light. In that context, the photoconductive element 114 may be regarded as a variable resistance element. The resistance value of the photoconductive element 114 may change by the amount of irradiated light (light intensity).

The photoconductive element 114 is formed using a semiconductor having a photoconductive effect between a pair of electrodes. A p-type or n-type semiconductor layer may be applied as a semiconductor layer, but in order to have a sufficiently high resistance value in a dark state, a substantially intrinsic semiconductor film is preferably used. The photoconductive element 114 may be realized by elements including a pn junction element using a semiconductor junction such as a p-type semiconductor and an n-type semiconductor, or a pin junction element provided with a substantially intrinsic i-type semiconductor between a p-type semiconductor and an n-type semiconductor.

The photoconductive element 114 has a resistance value to the extent that an active current IOL0 emitted by the light-emitting element 112 from the first power line 122 does not flow in a dark state. However, the photoconductive element 114 irradiated light with the emitted light from the light-emitting element 112 has a lower resistance value than the dark state. When the resistance value of the photoconductive element 114 decreases, the current flows from the first power line 122 to the light-emitting element 112. When the active current IEOL0 flows from the first power line 122 via the photoconductive element 114, the light emitted by the light-emitting element 112 is maintained. Further, at this time, at least the voltage VD of the first power line 122 is a higher potential than the potential VS of the second power line 124.

Method of Operation

Figure 3:
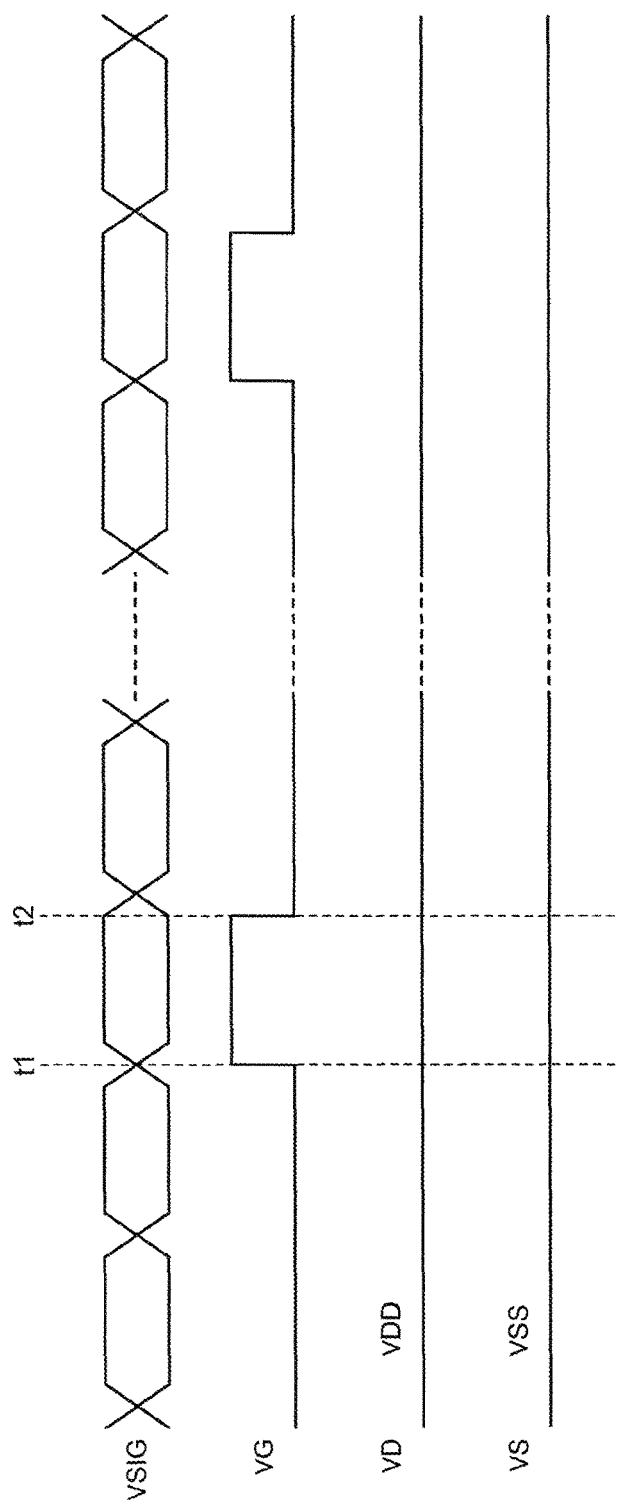
FIG. 3 is a diagram showing a timing chart describing the operation of the display device according to an embodiment of the present invention.

FIG. 3 shows a timing chart describing the operation of the pixel circuit shown in FIG. 2. This timing chart shows the change of the video signal voltage VSIG of the video signal line 120, the scanning signal voltage VG of the scanning signal line 118, the voltage VD of the first power line 122, and the voltage VS of the second power line 124.

When the voltage VG of the scanning signal line 118 becomes a high voltage (H level) at time T1, the transistor 110 is in an on state. The scanning signal line 120 and the node N1 go into a conduction state, and the video signal voltage VSIG is applied to node N1. At this time, when the video signal voltage VSIG is smaller than the light-emitting threshold voltage VthOL of the light-emitting element 112, the light-emitting 112 does not emit light. The resistance value of the dark state of the photoconductive element 114 is sufficiently large and an active current that the light-emitting element 112 emits does not flow from the first power line 122.

When the voltage VG of the scanning signal line 118 becomes a low voltage (L level) at time t2, the transistor 110 is turned off, and the node N1 is disconnected from the video signal line 120. For that reason, the light-emitting element 112 is maintained in state not emitting light. At this time, the voltage VD of the first power line 122 and the voltage VS of the second power line 124 are held at a constant potential. Further, the relationship of the voltage VD of the first power line 122 and the voltage VS of the second power line 124 is maintained at VD>VS.

On the other hand, at time t1, when the voltage VSIG of the node N1 is greater than the light-emitting threshold voltage VthOL of the light-emitting element 112, the active current IOL0 flows to the light-emitting element 112 and emits light. The luminance intensity of the light-emitting element 112 changes in response to the active current IOL0. A portion of the light output from the light-emitting element 112 radiates to the photoconductive element 114. The resistance value of the photoconductive element 114 is reduced compared to the dark state due to irradiated light. That is to say, the photoconductive element 114 transitions from a high-resistance state to a low-resistance state due to irradiated light. In this way, a current IRV large compared to the current of the dark state (dark current) flows in the photoconductive element 114. In this case, even after the transistor 110 is turned off and the node N1 is blocked from the video signal line 120 at time t2, if the current IRV is the same as or more sufficient than the active current IOL0, the current flows from the first power line 122 via the photoconductive element 114. At this time, the light emitted by the light-emitting element 112 is maintained.

In this way, according to the operations of the pixel circuit shown in FIG. 3, if the light-emitting element 122 emits light by a video signal, after, the resistance value of the photoconductive element 114 is reduced and the current flows in from the first power line 122, and the light-emitting state may be maintained. That is to say, without depending on the threshold voltage of the transistor, the light-emitting element 112 begins emitting light, and light emission may be maintained.

Figure 4:
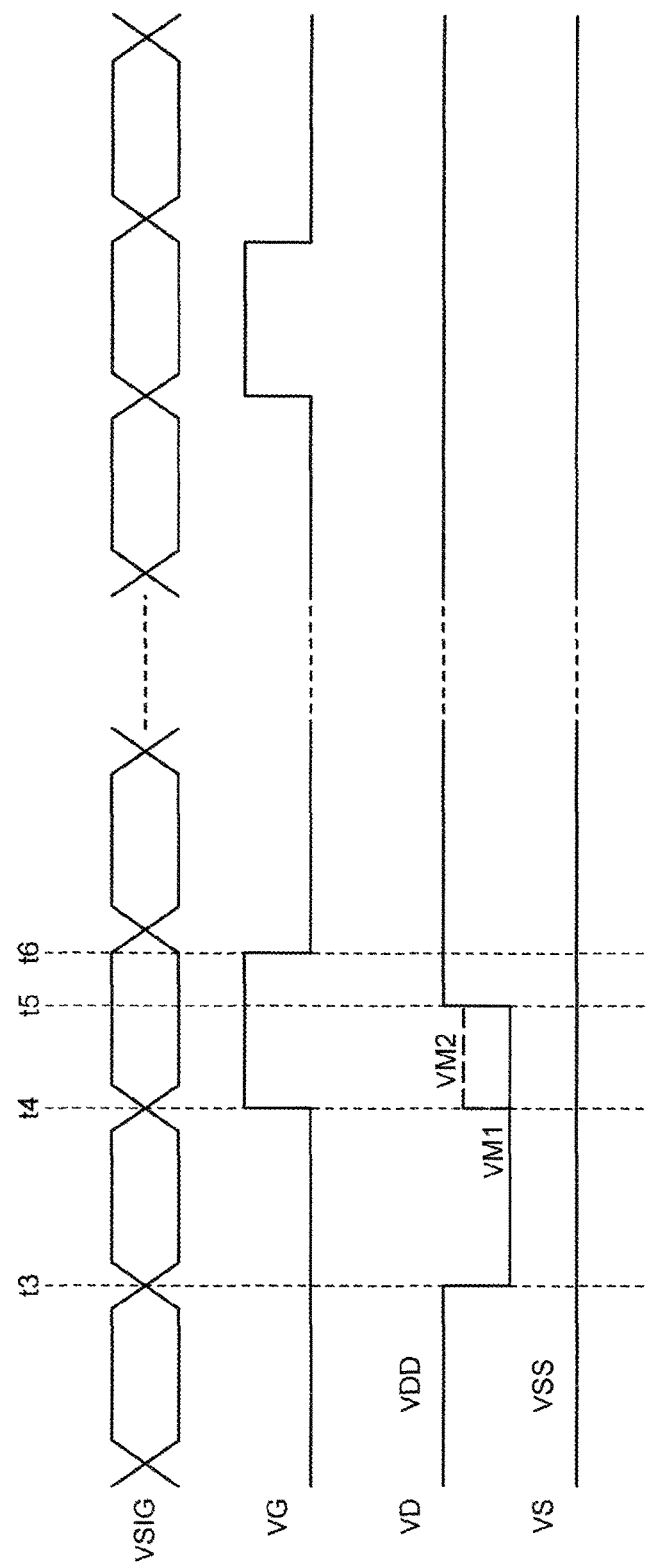
FIG. 4 is a diagram showing a timing chart describing the operation of the display device according to an embodiment of the present invention.

FIG. 4 shows another example describing the operation of the pixel circuit shown in FIG. 2. Here, the differences with FIG. 3 will be described.

At time t3, the voltage VD of the first power line 122 connected to the photoconductive element 114 changes from a high voltage VDD to a lower voltage VM1. Here, the low voltage VM1 is a voltage close to or lower than the light-emitting threshold voltage VthOL of the light-emitting element 112.

When the first power line 122 becomes a low voltage VM1, the current supply to the light-emitting element 112 quickly decreases. Thereby, the light-emitting element 112 stops emitting light. When the light-emitting element 112 stops emitting light, the resistance value of the photoconductive element 114 increases and returns to the resistance value of the dark state. That is to say, by changing the photoconductive element 114 from a low-resistance state to a high-resistance state, initialization is done. When the voltage of the node N1 does not change between time t3 and time t4, and the light-emitting element 112 does not emit light, the photoconductive element 114 is held at a high resistance. The interval between time t3 and time t4 may be any time as long as the time until the photoconductive element 114 returns to the resistance value of the dark state (high resistance) is secured, and may practically set the time to enable the above initialization.

For example, when the photoconductive element 114 uses resistance change by the photoconductive effect of the semiconductor layer, the time from time t3 to time t4 may secure the time until the photoexcited carrier disappears.

When the voltage VG of the scanning signal line 118 becomes a high voltage (H level) and the transistor 110 is turned on at time t4, the video signal line 120 and the node N1 conduct in the same way as in FIG. 2, and the potential of the node N1 becomes a signal voltage VSIG. When the voltage VSIG is greater than the light-emitting threshold voltage VthOL of the light-emitting element 112, the light-emitting element 112 emits light by the current from the video signal line 120.

At this time, the voltage VD of the first power line 122 is in a state of low voltage VM1, so when the resistance value of the photoconductive element 114 decreases due to the light-emitting element 112 emitting light, the transistor 110 is in an on state, so it is possible that the signal current from the video signal line 120 will flow into the first power line 122 side. To avoid this, the voltage VD of the first power line 122 in the period from time t4 to time t5 may be a high voltage VM2 greater than the low voltage VM1 and the largest value of the signal voltage VSIG. The time from time t4 to time t5 may be as short as possible. Or, the voltage VD of the power line 122 may go from a low voltage VM1 to a high voltage VDD at time t4.

At time t5, when the voltage VD of the first power line 122 is a high voltage VDD, similar to the case of FIG. 2, the current flows from the first power line 122 to the light-emitting element 112. At time t6, when the voltage of the scanning signal line 118 changes to a low voltage (L level), the transistor 110 turns off, the video signal line 120 and the node N1 are electrically blocked. However, the supply of current from the first power line 122 to the light-emitting element 112 via the photoconductive element 114 continues, so the light-emitting element 112 may maintain light emission.

According to the operation of the pixel circuit shown in FIG. 4, even when the resistance change of the photoconductive element 114 cannot sufficiently follow switching the light-emitting element 112 on and off (light emission and non-light emission), it becomes possible to accurately control the luminance of the light-emitting element 112. For example, when the light-emitting element 112 shifts from a state emitting light in one frame to the next frame and the resistance change of the photoconductive element 114 cannot follow, it is possible that as a result unintended light emission will remain like an afterimage. From the same cause, when the light-emitting element 112 emits light in one frame, when the light and dark state of the previous frame is influenced and the resistance change of the photoconductive element 114 cannot follow, the generation of a flaw in which luminance cannot be accurately emitted in response to video signal voltage may possibly occur. However, as is shown in FIG. 4, the light-emitting element 112 may be forcibly stopped from emitting light, and a time frame may be provided for initializing the photoconductive element 114, so flaws such as this may be avoided.

In the display device 100 according to an embodiment of the present invention, the timing of when the light-emitting element 112 begins emitting light is controlled by the transistor 110 connected to the video signal line. The transistor 110 retrieves video signals from the video signal line 120, and the light-emitting element 112 emits light based on these signals. The photoconductive element 114 in which reduces resistance by light emitted by the light-emitting element 112 is provided in the pixel 104. When the light-emitting element 112 emits light, active current flows into the light-emitting element 112 from the power line via the photoconductive element 114 which reduces resistance, so the light-emitting element 112 may maintain light emission.

In this way, the current when the light-emitting element 112 emits light is controlled by the photoconductive element 114 which is substantially seen as a resistance element, so the light-emitting element 112 may emit light without being influenced by varying threshold voltage of the transistor.

According to the pixel circuit according to the present embodiment, a drive transistor for controlling the current flowing in the light-emitting element 112 by the drain current in response to gate voltage is not provided. The transistor 110 controls on-off operations. The light-emitting element 112 emits light at a luminance based on the video signal voltage VSIG, and if light emission begins, current flows in response to that luminance from the first power line 122 via the photoconductive element 114. However, the light-emitting element 112 emits light without being influenced by a varying threshold voltage of the transistor, and may maintain the light-emitting state.

At this time, the current IRV flowing into the light-emitting element 112 from the first power line 122 is preferably equal to the active current IOL0 (IRV=IOL0), but this is not an absolute requirement. For example, when IRV>IOL0, the luminance intensity of the light-emitting element 112 increases with time, and when IRV<IOL0, the luminance intensity of the light-emitting element 112 decreases with time. However, in the display device 100, the video signal written in the pixel 104 is rewritten or written again at a set time. For that reason, the light-emitting element 112 may maintain light-emission only during a certain period of time, and to one extent or another the change in luminance may be considered to be within an acceptable range.

According to the present embodiment, pixels provided with a light-emitting element may have one transistor and photoconductive element, and the number of necessary elements in one pixel may be reduced. That is to say, even without providing conventionally necessary drive transistors and correction circuits for compensating the threshold voltage of these drive transistors, a display device preventing varying luminance may be realized. A drive transistor for controlling the current of the light-emitting element is not necessary, so the threshold voltage of this drive transistor does not have to be strictly controlled, so the process margin in the production of the display device may expand.

Modified Example of Pixel Circuit

In the present embodiment, in the pixel circuit shown in FIG. 2, by further adding a capacitive element, operations may be stabilized. An example of this will be described below while referencing FIG. 5, FIG. 6, and FIG. 7.

Figure 5:
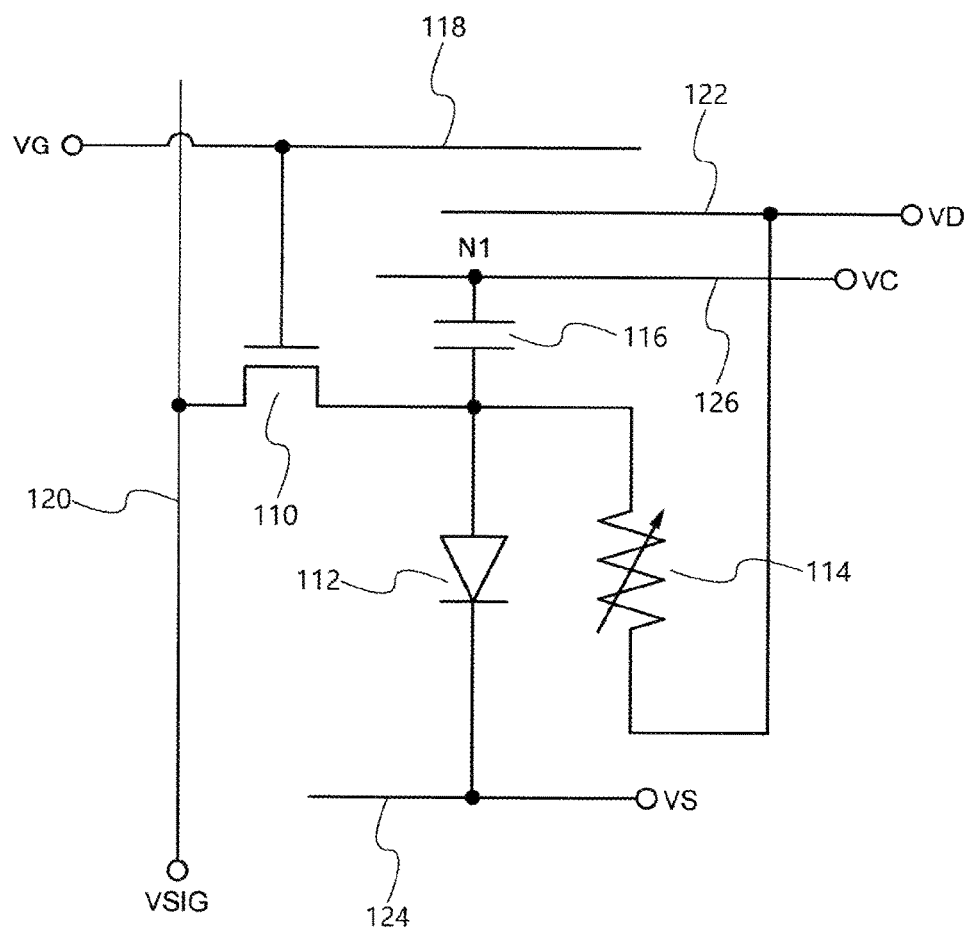
FIG. 5 is a diagram showing the circuit structure of a pixel of the display device according to an embodiment of the present invention.

FIG. 5 shows an example of a capacitive element 116 connecting to the node N1. One of the terminals of the capacitive element 116 is connected to the node N1, and the other terminal is connected to a capacity line 126. A constant voltage VC is applied in the capacity line 126. In this pixel circuit, when the transistor 110 turns on, the video signal line 120 and the node N1 conduct, and the capacitive element 116 is charged by the video signal voltage VSIG. After the transistor 110 turns off, the light-emitting element 112 may emit light by the video signal voltage VSIG charged by the capacitive element 116. At this time, by controlling the potential of the capacity line 126, writing of the video signal and light emission for the pixel may be controlled.

Figure 6:
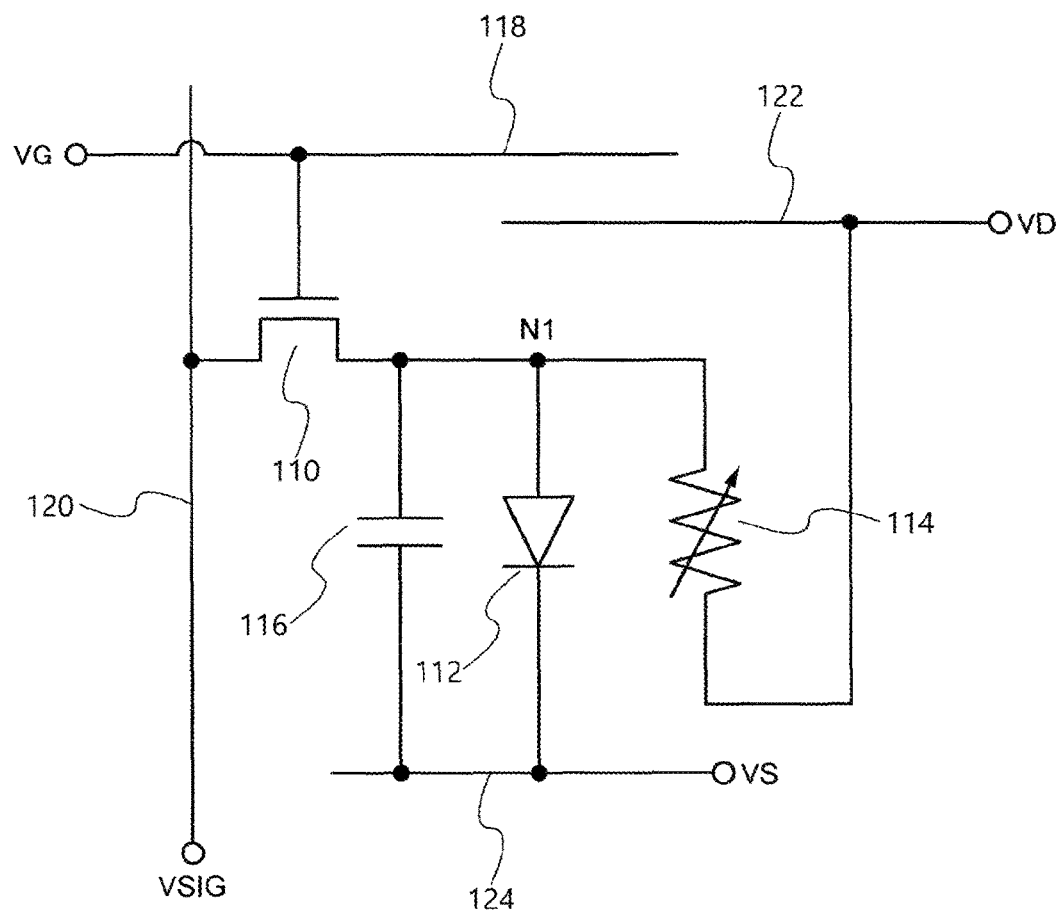
FIG. 6 is a diagram showing the circuit structure of a pixel of the display device according to an embodiment of the present invention.

FIG. 6 shows an example in which one of the terminals of the capacitive element 116 is connected to the second power line 124. In the pixel circuit shown in FIG. 6, the light-emitting element 112 may emit light by video signal voltage VSIG charged by the capacitive element 116. The other terminal of the capacitive element 116 is connected to the second power line 124, so the capacity line 126 shown in FIG. 5 may be omitted.

Figure 7:
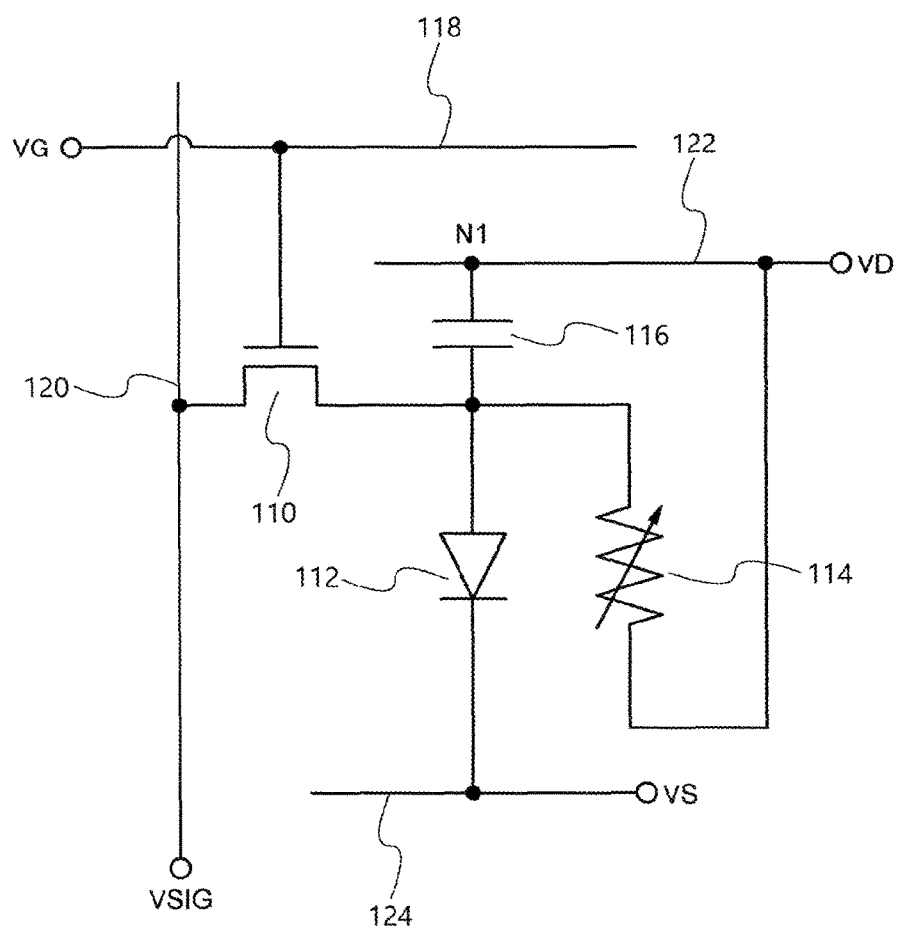
FIG. 7 is a diagram showing the circuit structure of a pixel of the display device according to an embodiment of the present invention.

FIG. 7 shows an example in which one of the terminals of the capacitive element 116 is connected to the first power line 122. As is shown in FIG. 3, when the voltage of the first power line 122 is constant, one of the terminals of the capacitive element 116 is connected to the first power line 122, and a capacity line may be omitted. In any case, by adding the capacitive element 116 to the pixel circuit, the light emitted by the light-emitting element 112 may be stabilized.

As is shown in FIG. 5, FIG. 6, and FIG. 7, by adding a capacitive element to the pixel circuit, the light-emitting state of the light-emitting element may be stabilized.

Photoconductive Element

Figure 8A:
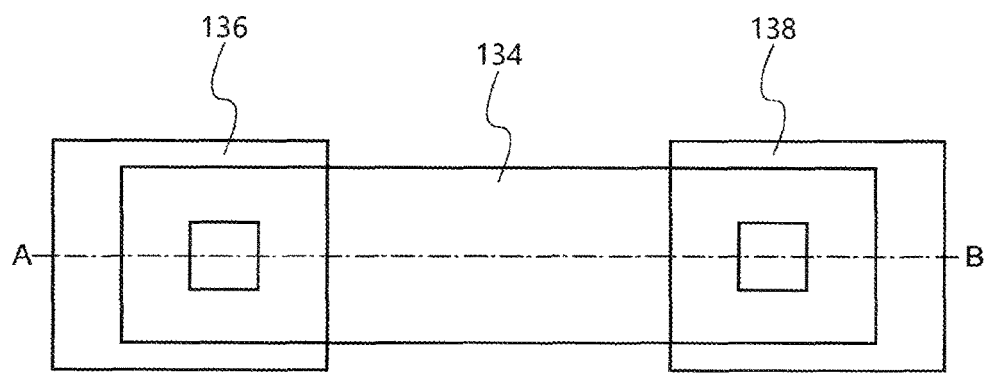
FIG. 8A is a plan view showing the structure of the photoconductive element according to an embodiment of the present invention.
Figure 8B:
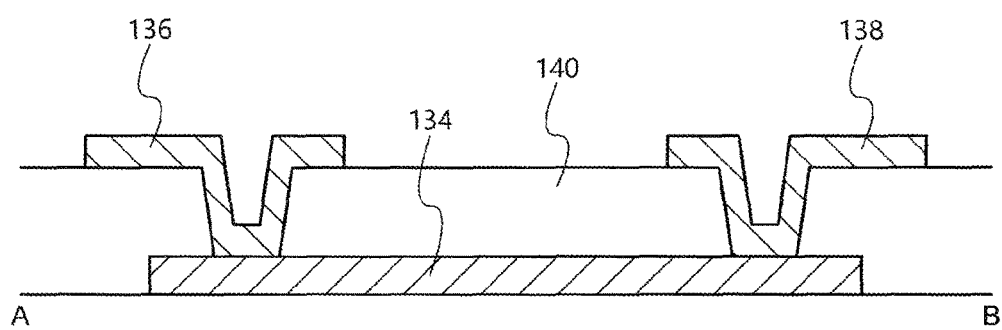
FIG. 8B is a cross-sectional view showing the structure of the photoconductive element according to an embodiment of the present invention.

FIG. 8A and FIG. 8B show an example of the photoconductive element 114. FIG. 8A is a cross-sectional view of the photoconductive element 114, and a cross-sectional structure facing the line A-B of the same diagram is shown in FIG. 8B. The photoconductive element 114 shown in FIG. 8A and FIG. 8B has a structure in which a first electrode 136 and a second electrode 138 are provided in a photoconductive layer 134 having a photoelectric effect. The first electrode 136 and the second electrode 138 are provided so as to sandwich an insulating layer 140 and contact in both terminals of the photoconductive layer 134. The photoconductive layer 134 preferably uses a semiconductor having a photoelectric effect and may use, for example, a silicon (Si) semiconductor, a germanium (Ge) semiconductor, and the like. As the photoconductive layer 134, a compound semiconductors such as CdTe, CuInSe$_2$, and CuInS or the like may be used.

Since amorphous silicon has a high ratio of dark conductivity and photoconductivity, it is preferably used as the semiconductor in the photoconductive element 114. Amorphous silicon has a dark conductivity of $10^{-10}$ S/cm or less, while photoconductivity is expected to be $10^{-6}$ S/cm or more depending on light radiation intensity. For this reason, it works as a high-resistance element in a dark state, and may be used as a low-resistance element during photoconductivity. The thin film formation of amorphous silicon is easily, and the light absorption coefficient in the visible light spectrum is greater than that of a crystalline silicon semiconductor. For this reason, without drastically modifying the manufacturing process of the display device, the photoconductive element 114 may be provided in the pixels.

Figure 9A:
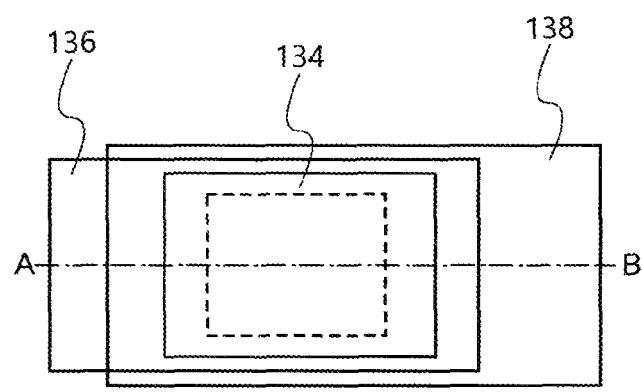
FIG. 9A is a plan view showing the structure of the photoconductive element according to an embodiment of the present invention.
Figure 9B:
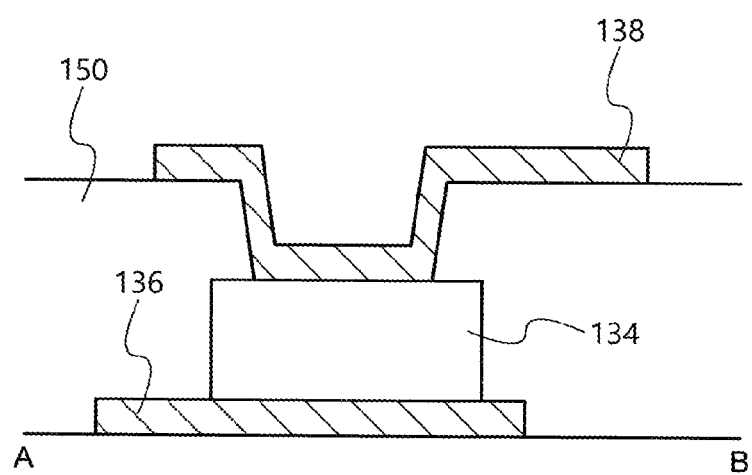
FIG. 9B is a cross-sectional view showing the structure of the photoconductive element according to an embodiment of the present invention.

FIG. 9A and FIG. 9B show another example of the photoconductive element 114. FIG. 9A is a cross-sectional view of the photoconductive element 114, and a cross-sectional structure facing the A-B line of the same diagram is shown in FIG. 9B. This photoconductive element 114 is provided with a first electrode 136 and a second electrode 138 above and below so as to sandwich the photoconductive layer 134. In this case, if one of the first electrode 136 and the second electrode 138 is a light-transmissive electrode, a portion of the light emitted from the light-emitting element 112 is injected into the photoconductive layer 134.

Various semiconductors having a photoelectric effect similar to that described above may be used in the photoconductive element 114 shown in FIG. 9A and FIG. 9B. If amorphous silicon, for example, is used as the photoconductive layer 134, a film thickness of about 100 nm to 500 nm may sufficiently absorb visible light. The region in which the first electrode 136 and the second electrode 138 overlap with the photoconductive layer 134 is used as the active surface area of elements, so it is useful for miniaturization.

In the photoconductive element 114 shown in FIG. 8A, FIG. 8B, FIG. 9A, and FIG. 9B, the photoconductive layer 134 may have one conductivity type semiconductor materials (p-type, i-type (intrinsic), or n-type). For the photoconductive layer 134, a pn junction may be provided as a p-type on one side and an n-type semiconductor on the other side of the first electrode 136 and the second electrode 138. Further, an i-type region may be provided between the p-type and n-type regions provided in the photoconductive layer 134. By making the photoconductive element 114 a diode type element provided with a pn junction or pin junction, a carrier excited by light is drifted by an internal electric field, so light response speed may increase.

Structure of Pixels

Figure 10:
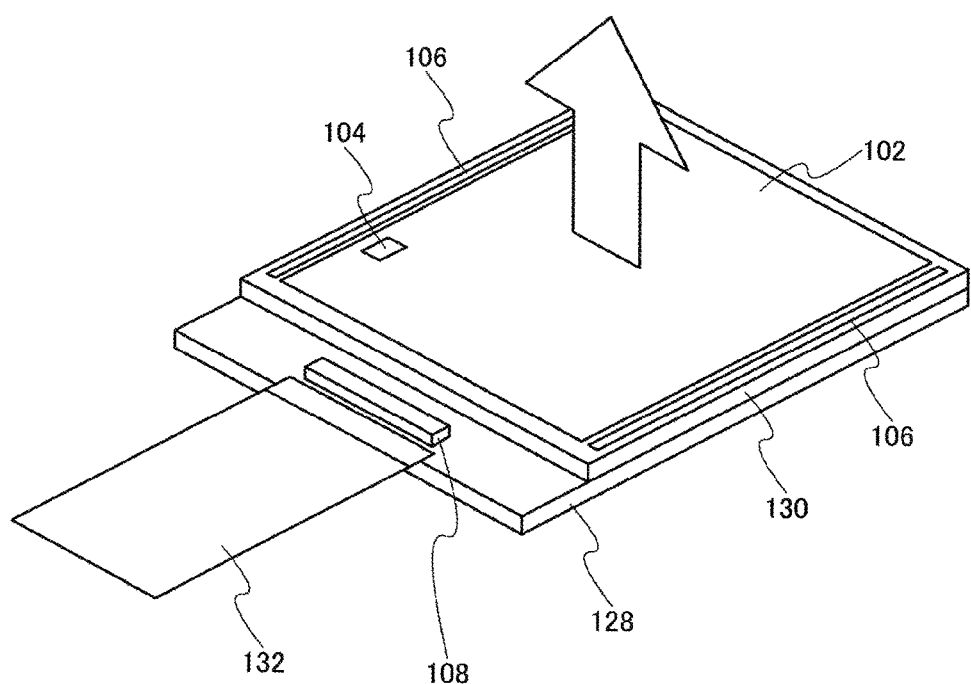
FIG. 10 is a perspective view showing the structure of the display device according to an embodiment of the present invention.

FIG. 10 shows a perspective view of the structure of the display device 100 according to the present embodiment. In the display device 100, a second substrate 130 is arranged facing a first substrate 128 and fixed by seal materials. A pixel circuit is provided and a pixel part 102 is formed on the first substrate 128. The pixel part 102 is sealed so as not to be exposed to the atmosphere by the second substrate 130. The second substrate 130 may be a hard substrate such as a glass substrate, but may also be an organic resin film substrate or an organic resin layer.

A scanning signal line drive circuit 106 and a video signal line drive circuit 108 are provided on the first substrate 128. A wiring substrate 132 is connected in the terminal portion of the first substrate 128. The wiring substrate 132 may be called a flexible circuit board (FPC substrate), and video signals and drive power from exterior devices are supplied inside the display device 100.

Figure 11:
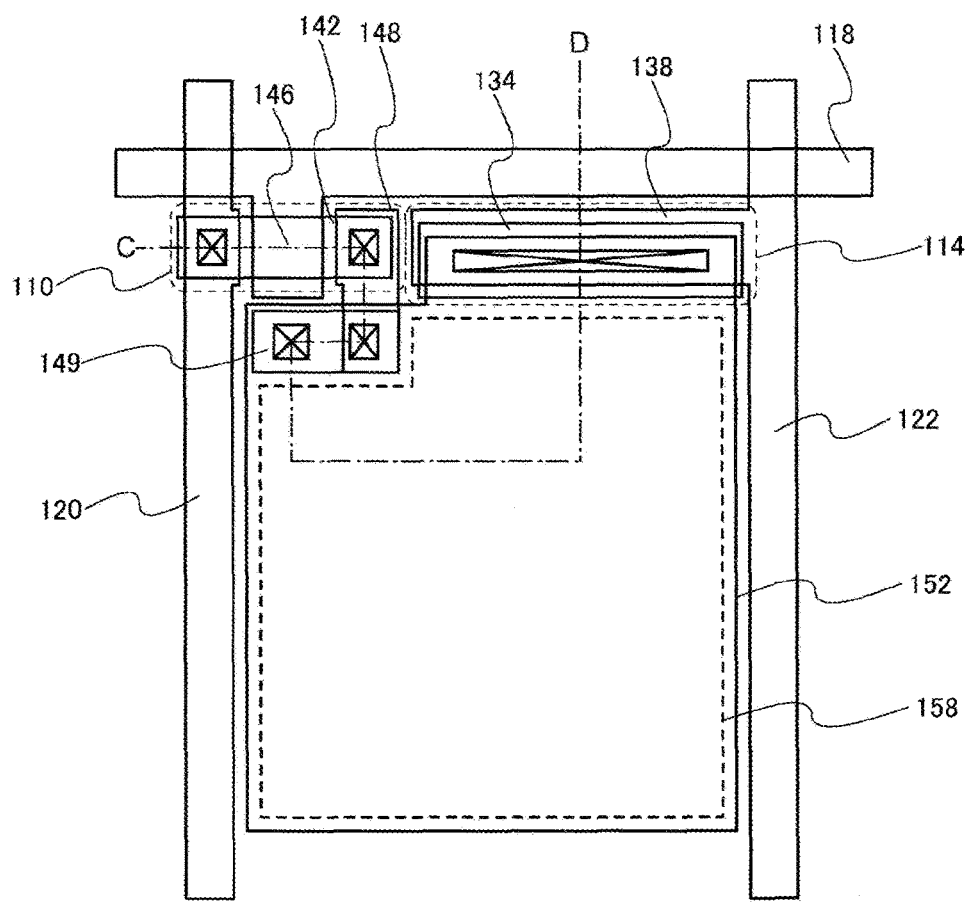
FIG. 11 is a plan view showing the structure of a pixel of the display device according to an embodiment of the present invention.
Figure 12:
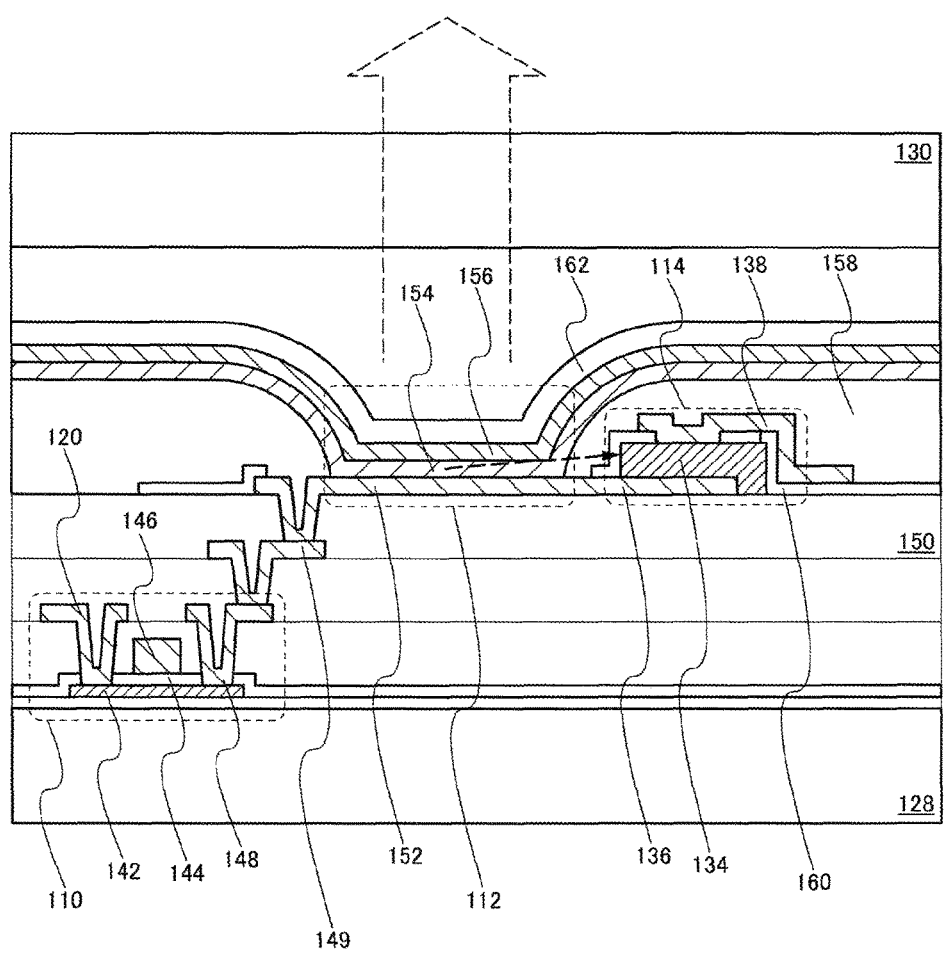
FIG. 12 is a cross-sectional view showing the structure of a pixel of the display device according to an embodiment of the present invention.

The structure of the pixel 104 provided in the pixel part 102 will be described while referencing FIG. 11 and FIG. 12. FIG. 11 is a plan view of the pixel, and a cross-sectional structure taken along line C-D of the same diagram is shown in FIG. 12. Both diagrams will be referenced in the description below.

The pixel 104 is configured including a transistor 110, a light-emitting element 112, and a photoconductive element 114. The transistor 110 is provided with a semiconductor layer 142 in which a channel is formed and a gate electrode 146 via a gate insulating layer 144. In the transistor 110, one of the input-output terminals is connected to the video signal line 120, and the other input-output terminal is connected to the source/drain electrode 148, 149. The source/drain electrode 148, 149 is electrically connected to the light-emitting element 112. A semiconductor layer 142 forming the channel of the transistor 110 may be formed of a silicon based semiconductor such as amorphous silicon and polysilicon. The semiconductor layer 142 may formed using oxide semiconductors or organic semiconductors.

The transistor 110 is provided so as to be embedded in the interlayer insulating layer 150. The layer structure of the interlayer insulating layer 150 is arbitrary. The interlayer insulating layer 150 may be configured appropriately combining inorganic insulating layers such as oxide silicon and nitride silicon, and organic insulating layers such as polyimide resin and acrylic resin.

The light-emitting element 112 is provided above this interlayer insulating layer 150. The light-emitting element 112 is configured including a pixel electrode 152 provided for each pixel, a light-emitting layer 154 formed including light-emitting materials, and a common pixel electrode 156 provided above the light-emitting layer 154. The structure of the light-emitting layer 154 is arbitrary, and may be formed using organic electroluminescence materials.

Low molecular type and high molecular type materials may be used as organic electroluminescence materials. When low molecular type organic materials are used, in addition to layers in which guest material and host materials are combined, the light-emitting layer 154 is configured including a hole injection layer and an electron injection layer, and a hole transport layer and an electron transport layer so as to sandwich this layer. By the selection of light-emitting material, the light-emitting element can emit light of each spectrum of red, green, and blue. By this, each pixel may be made corresponding to each color. For the light-emitting element 112 to emit white light, it may have a structure in which layers including light-emitting materials corresponding to each color red (R), green (G), and blue (B) of the organic EL layer 154, are stacked, or a structure in which layers including light-emitting materials corresponding to two colors blue (B) and yellow (Y) are stacked.

In the light-emitting element 112, the pixel electrode 152 is connected to the source and drain electrodes 148, 149 which are input-output terminals of the transistor via a contact hole provided in the interlayer insulating layer 150. Voltage is applied to the pixel electrode 152 based on the video signal given by the video signal line 120 via the transistor 110. The common pixel electrode 156 is provided so as to be shared between a plurality of pixels, and a common potential is applied between the pixels.

The periphery of the pixel electrode 152 is covered by a bank layer 158. In other words, the bank layer 158 opens the inner region excluding the periphery of the pixel electrode 152 and the contact hole region. The light-emitting layer 154 and the common pixel electrode 156 are provided upper side layer of the bank layer 158. The light-emitting layer 154 and the common pixel electrode 156 are stacked in the region in which the pixel electrode 152 is opened in the bank layer 158. The region in which the pixel electrode 152, the light-emitting layer 154, and the common electrode 156 overlap becomes a substantial light-emitting region. That is to say, the stacked region becomes a region functioning as the light-emitting element 112. A passivation layer 162 may be provided above the common pixel electrode 156.

The light-emitting element 112 is configured so that light is reflected by the pixel electrode 152 and light passes through the common pixel electrode 156 when light is output on the second substrate 130 side provided above the first substrate 128. Light emitted in the light-emitting layer 154 radiates in every direction, so a light-reflective surface is provided in the pixel electrode 152 in order to increase the amount of light emitted of the pixel 104. A light-reflective surface may be provided on the rear surface side of the pixel electrode 152. When the light-emitting layer 154 is configured by organic electroluminescence materials, one of the pixel electrode 152 and the common pixel electrode 156 is an anode, and the other is a cathode. When the pixel electrode 152 side is an anode, conductive materials with high work function are preferably used. Conductive materials such as indium tin oxide (ITO) may be used as these electrode materials. Since ITO and the like have light transmissivity, in order to make the pixel electrode a light-reflective electrode, a metal layer such as silver or aluminum may be provided on the rear surface. On the other hand, to make the common pixel electrode 156 a cathode, it may be configured including low work function materials such as lithium (Li) and magnesium (Mg). For example, this layer including metals and transparent conductive film such as ITO may be combined and used as the common pixel electrode 156.

The photoconductive element 114 is arranged at a location in which a portion of the light emitted from the light-emitting element 112 is radiated. However, if it overlaps with the light-emitting surface of the pixel 104, the aperture ratio decreases. For this reason, the photoconductive element 114 is preferably arranged in the periphery of the light-emitting element 112.

FIG. 11 and FIG. 12 show an example in which the photoconductive element 114 is provided in a region overlapping the bank layer 158. The bank layer 158 covers the periphery of the first electrode 136 and has a function which mitigates unevenness. The photoconductive element 114 may be provided so as to be embedded in a bank layer 158 such as this. By providing the photoconductive element 114 overlapping the bank layer 158, the aperture ratio of the pixel may be not reduced.

As is shown in FIG. 2, the photoconductive element 114 is a two-terminal element in which one is connected to the first power line 122 and the other is connected to the pixel electrode of the light-emitting element 112. The photoconductive element 114 shown in FIG. 11 and FIG. 12 has a structure provided with a pair of electrodes above and below the photoconductive layer 134. Here, for the sake of convenience, in the relationship with FIG. 10, the electrode under the photoconductive layer 134 corresponds to the first electrode 136, and the electrode above the photoconductive layer 134 corresponds to the second electrode 138. The first electrode 136 is formed by extending the pixel electrode 152 of the light-emitting element 112 to below the bank layer 158. In this way, the pixel electrode 152 doubles as a first electrode 136, so the connection structure of the light-emitting element 112 and the photoconductive element 114 may be simplified.

The photoconductive layer 134 is provided so as to have a region overlapping the first electrode 136. The second electrode 138 is provided so as to cover one surface of the photoconductive layer 134. In the present embodiment, an insulating layer 160 is provided above the photoconductive layer 134, and the second electrode 138 is connected to the photoconductive layer 134 in an opening of the insulating layer 160. Further, the insulating layer 160 is not an essential structure. However, by connecting the second electrode 138 to the photoconductive layer 134 at the opening of the insulating layer 160 provided on the upper surface portion covering the side surface portion of the photoconductive layer 134, short-circuiting of the first electrode 136 and the second electrode 138 may be prevented.

Other than being emitted from the second substrate 130 side, a portion of the light emitted from the light-emitting layer 154 may be emitted in a diagonal direction of the bank layer 158. The bank layer 158 may be formed using insulating materials having light-transmissivity. When the bank layer 158 is light-transmissive, a portion of the light emitted from the light-emitting layer 154 shines through the bank layer 158 and is injected into the photoconductive layer 134 of the photoconductive element 114. By emitting light, a photoexcited carrier is generated and the resistivity decreases in the photoconductive layer 134. The operation of the pixel circuit accompanying this is as described in FIG. 2.

By providing the second electrode 138 which is one of the electrodes of the photoconductive element 114 above the side surface of the photoconductive layer 134, light emitted from the adjacent pixel 104 may be blocked. The second electrode 138 doubles as a light shielding layer, so malfunctions of the photoconductive element 114 may be prevented.

According to the pixel 104 shown in FIG. 11 and FIG. 12, by providing the photoconductive element 114 in a region overlapping the bank layer 158, the aperture ratio of the pixel 104 may be not reduced. The photoconductive element 114 may be provided adjacent to the light-emitting element 112, so light-responsivity and sensitivity may be improved.

Figure 13:
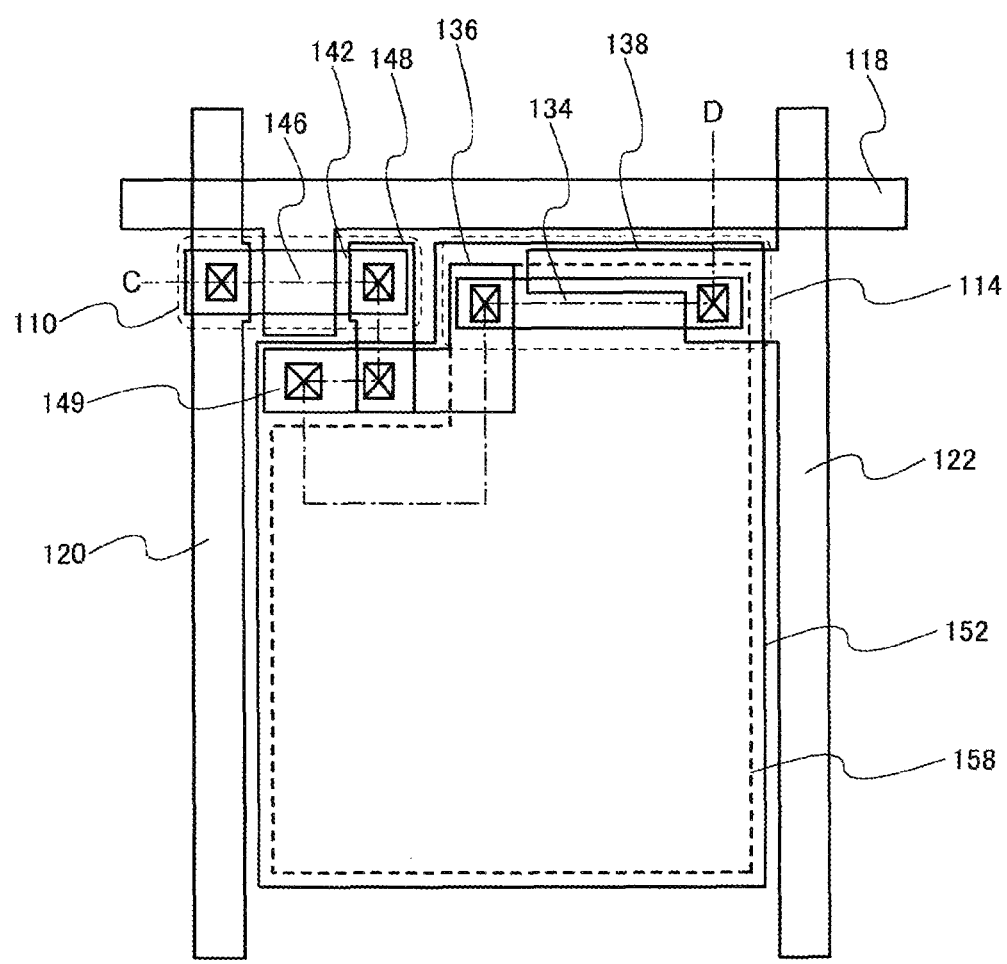
FIG. 13 is a plan view showing the structure of a pixel of the display device according to an embodiment of the present invention.
Figure 14:
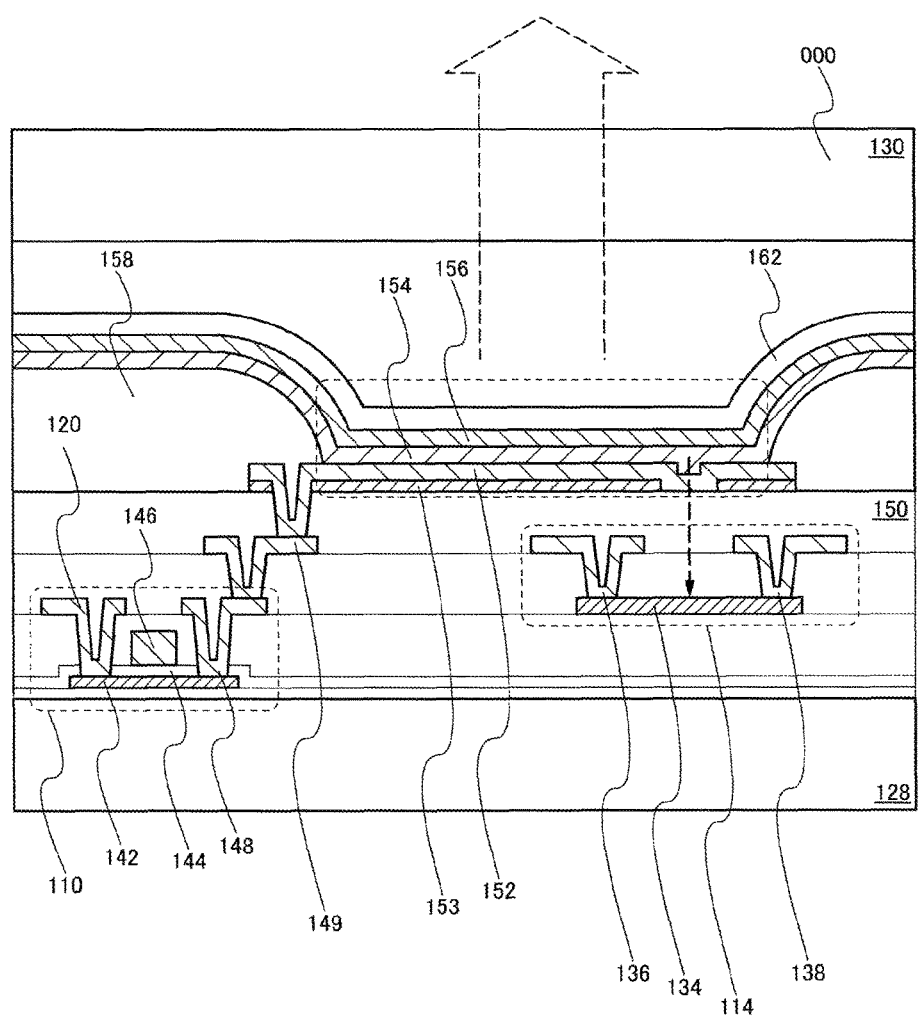
FIG. 14 is a cross-sectional view showing the structure of a pixel of the display device according to an embodiment of the present invention.

FIG. 13 and FIG. 14 show another example of the pixel 104 according to the present embodiment. FIG. 13 is a plan view of the pixel, and the cross-sectional structure taken along line E-F of the same diagram is shown in FIG. 14. In the description below, aspects different from FIG. 11 and FIG. 12 are described.

As is shown in FIG. 14, the photoconductive element 114 is provided so as to be embedded by the interlayer insulating layer 150. As is shown in FIG. 13, the photoconductive element 114 is provided so as to overlap the pixel electrode 152. The photoconductive element 114 has the same element structure as that described in FIG. 9A and FIG. 9B, and the first electrode 136 and the second electrode 138 connected to the photoconductive layer 134 are arranged. In this case, the second electrode 138 doubles as the first power line 122. Because of this, the photoconductive element 114 may be provided without increasing the layer structure of the interlayer insulating layer. By providing the photoconductive element 114 so as to be embedded in the interlayer insulating layer 150, the aperture ratio of the pixel may be reduced.

In this case, the photoconductive element 114 is arranged at a location in which the light-emitting element 112 emits light. For example, the photoconductive element 114 may be provided so that a portion overlaps the light-emitting element 112. Further, a light-transmitting window may be provided in the pixel electrode 152 so that the light-emitting element 112 can emit light. For example, a reflection layer 153 formed of metal materials such as aluminum is provided and an opening in this reflection layer 153 are provided below the pixel electrode 152 formed as a light-reflective electrode.

Because of a structure of the pixel electrode 152 such as this, the light-emitting layer 154 may emit light in the photoconductive layer 134.

The photoconductive element 114 uses the first electrode 136 or the second electrode 138 as a light shielding layer in order to shield the light emitted from adjacent pixels. In FIG. 13, the second electrode 138 is provided along the photoconductive layer 134 so as to shield light from one of the surfaces of the photoconductive layer 134. The second electrode 138 is formed of metal materials, so it may be used as a light-shielding layer.

According to the structure of the pixel 104 shown in FIG. 13 and FIG. 14, the intervals between adjacent pixels may be narrowed.

In this way, it is an advantageous structure for achieving higher-definition pixels.

What is claimed is:

1. A display device comprising:
   a transistor including a gate terminal, a first input-output terminal and a second input-output terminal, the gate terminal connected to a scanning signal line and the first input-output terminal connected to a video signal line;
   a photoconductive element including a first terminal and a second terminal, the first terminal connected to the second input-output terminal of the transistor, and the second terminal connected to a first power line; and
   a light-emitting element including a third terminal and a fourth terminal, the third terminal connected to the second input-output terminal of the transistor, and the fourth terminal connected to a second power line, wherein
   a video signal voltage is input to the first terminal of the light-emitting element and the light-emitting element emits light based on the transistor turned on at time t1,
   when the light-emitting element emits light to the photoconductive element, a resistance of the photoconductive element transfers from a high-resistance state to a low-resistance state, and
   a current for maintaining a light-emitting state is supplied from the first power line to the light-emitting element, even after the transistor turns off at time t2 which is later than time t1.

2. The display device according to claim 1,
   wherein the photoconductive element is provided in a location in which the light of the light-emitting element radiates.

3. The display device according to claim 2,
   wherein a resistance value of the photoconductive element decreases when the light is radiated.

4. The display device according to claim 1,
   wherein a capacitive element is connected to the second input-output terminal of the transistor.

5. The display device according to claim 1, further comprising a capacitive element,
   wherein the capacitive element is connected between the second input-output terminal of the transistor and the second power line.

6. A display device comprising:
   a transistor including a gate connected to a scanning signal line, and one of a source and a drain connected to a video signal line;
   a light-emitting element including a pixel electrode, a light-emitting layer above the pixel electrode, and a common pixel electrode above the light-emitting layer; and
   a photoconductive element including a first electrode, a second electrode, and a photoconductive layer connected to each of the first electrode and the second electrode, wherein
   the pixel electrode is connected to another of the source and the drain of the transistor,
   the first electrode is connected to the pixel electrode, the second electrode is connected to a power line,
   when a video signal voltage is input into the light-emitting element and the light-emitting element emits light based on the transistor turned on at time t1,
   when the photoconductive element receives a light of the light-emitting element, a resistance of the photoconductive element transfers from a high-resistance state to a low-resistance state, and
   a current for maintaining a light-emitting state is supplied from the first power line to the light-emitting element, even after the transistor turns off at time t2 which is later than time t1.

7. The display device according to claim 6,
   wherein the photoconductive element is provided in a location in which the light of the light-emitting element radiates.

8. The display device according to claim 6,
   wherein the photoconductive layer is a semiconductor layer for having a photoelectric effect.

9. The display device according to claim 6, further comprising a bank layer covering a periphery of the pixel electrode,
    wherein the photoconductive element is embedded in the bank layer.

10. The display device according to claim 6, further comprising an interlayer insulating layer between the transistor and the light-emitting element,
    wherein the photoconductive element is embedded in the interlayer insulating layer.

* * * * *